United States Patent
Swamy

(10) Patent No.: US 11,791,799 B2
(45) Date of Patent: Oct. 17, 2023

(54) LADDER-TYPE SURFACE ACOUSTIC WAVE DEVICE

(71) Applicant: Qorvo US, Inc., Greensboro, NC (US)

(72) Inventor: Manjunath Swamy, Altamonte Springs, FL (US)

(73) Assignee: Qorvo US, Inc., Greensboro, NC (US)

( * ) Notice: Subject to any disclaimer, the term of this patent is extended or adjusted under 35 U.S.C. 154(b) by 78 days.

(21) Appl. No.: 17/379,090

(22) Filed: Jul. 19, 2021

(65) Prior Publication Data

US 2021/0351763 A1 Nov. 11, 2021

Related U.S. Application Data

(62) Division of application No. 16/225,947, filed on Dec. 19, 2018, now Pat. No. 11,070,194.

(60) Provisional application No. 62/719,284, filed on Aug. 17, 2018.

(51) Int. Cl.
*H03H 9/64* (2006.01)

(52) U.S. Cl.
CPC .......... *H03H 9/6483* (2013.01); *H03H 9/645* (2013.01); *H03H 9/6453* (2013.01)

(58) Field of Classification Search
CPC .... H03H 9/6483; H03H 9/645; H03H 9/6453; H03H 9/6436
USPC .......................................... 333/133, 193–196
See application file for complete search history.

(56) References Cited

U.S. PATENT DOCUMENTS

| 6,255,916 | B1 | 7/2001 | Nakamura et al. |
| 11,070,194 | B2 | 7/2021 | Swamy |
| 2007/0069837 | A1 | 3/2007 | Nishimura et al. |
| 2016/0094200 | A1* | 3/2016 | Kim ..................... H03H 9/6456 333/195 |

OTHER PUBLICATIONS

Beaudin, Steve, et al., "Shoulder Suppressing Technique for Dual Mode SAW Resonators," Ultrasonics Symposium, Oct. 1999, IEEE, pp. 389-393.
Gulyaev, Yuri, et al., "Comparitive Analysis of Synchronous 'Hiccup' and Non-Synchronous SAW Resonator on Quartz," Multiconference on Electronics and Photonics, Nov. 2006, IEEE, pp. 83-86.
Hashimoto, Ken-Ya, et al., "Design Considerations on Wideband Longitudinally-Coupled Double-Mode SAW Filters," Ultrasonics Symposium, Oct. 8-11, 2002, Munich, Germany, IEEE, 9 pages.
(Continued)

*Primary Examiner* — Rakesh B Patel
*Assistant Examiner* — Jorge L Salazar, Jr.
(74) *Attorney, Agent, or Firm* — Withrow & Terranova, P.L.L.C.

(57) ABSTRACT

The present disclosure relates to a ladder-type surface acoustic wave (SAW) device, which includes a piezoelectric layer, two reflective structures, at least one series interdigital transducer (IDT) coupled between a first signal point and a second signal point, and at least one shunt IDT. The at least one shunt IDT is coupled at least between the first signal point and ground, or between the second signal point and ground. Herein, the two reflective structures, the at least one series IDT, and the at least one shunt IDT reside over the piezoelectric layer. The at least one series IDT and the at least one shunt IDT are arranged between the two reflective structures.

20 Claims, 14 Drawing Sheets

(56) References Cited

OTHER PUBLICATIONS

Heep, L.W., "Selective Null Placement in SAW Coupled Resonator Filters," Ultrasonics Symposium, 1991, IEEE, pp. 185-188.
Inoue, Shogo, et al., "Ultra-Steep Cut-Off Double Mode SAW Filter and Its Application to a PCS Duplexer," Transactions on Ultrasonics, Ferroelectrics, and Frequency Controls, vol. 54, Issue 9, Sep. 2007, IEEE, pp. 1882-1887.
Roh, Y.R., et al., "New Type Double Mode SAW Resonator Filters on 64 Y-X LiNb03," International Frequency Control Sympsoium, 1996, IEEE, pp. 194-198.
Rosenberg, Robert, et al., "Scattering Analysis and Design of Saw Resonator Filters," IEEE Transactions on Sonics and Ultrasonics, vol. SU-26, Issue 3, May 1979, pp. 205-230.
Staples, E.J., et al., "SAW Resonators and Coupled Resonator Filters," Annual Symposium on Frequency Control, Jun. 1976, IEEE, pp. 322-327.
Wang, Weibiao, et al., "Minimizing the Bulk-Wave Scattering Loss in Dual-Mode SAW Devices," Transactions on Ultrasonics, Ferroelectrics, and Frequency Control, vol. 53, Issue 1, Jan. 2006, IEEE, pp. 193-198.
Non-Final Office Action for U.S. Appl. No. 16/225,947, dated Sep. 3, 2020, 7 pages.
Notice of Allowance and Examiner-Initiated Interview Summary for U.S. Appl. No. 16/225,947, dated Mar. 18, 2021, 8 pages.
Notice of Allowance for U.S. Appl. No. 17/379,111, dated May 31, 2023, 7 pages.

* cited by examiner

LADDER-TYPE SURFACE ACOUSTIC WAVE DEVICE

RELATED APPLICATIONS

This application is a divisional of U.S. patent application Ser. No. 16/225,947, filed on Dec. 19, 2018, which claims the benefit of provisional patent application Ser. No. 62/719,284, filed Aug. 17, 2018, the disclosures of which are hereby incorporated herein by reference in their entireties.

FIELD OF THE DISCLOSURE

The present disclosure relates to a surface acoustic wave (SAW) device, and particularly to a ladder-type SAW device with both series and shunt interdigital transducers (IDTs).

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Surface acoustic wave (SAW) devices, such as SAW resonators and SAW filters, are used in many applications such as radio frequency (RF) filters. For example, the SAW filters are commonly used in second generation (2G), third generation (3G), and fourth generation (4G) wireless receiver front ends, duplexers, and receive filters. The widespread use of the SAW filters is due, at least in part, to the facts that the SAW filters exhibit low insertion loss with good rejection, can achieve broad bandwidths, and are a small fraction of the size of traditional cavity and ceramic filters. As the use of the SAW filters in modern RF communication systems and mobile devices increases, there is a need for SAW filters with sharp transitions between desired passband frequencies and frequencies that are outside of desired passbands. In addition, there is also a need for SAW filters with reduced size.

SUMMARY

The present disclosure relates to a ladder-type surface acoustic wave (SAW) device with both series and shunt interdigital transducers (IDTs). The disclosed SAW device includes a piezoelectric layer, two reflective structures, at least one series IDT, and at least one shunt IDT. The at least one series IDT is coupled between a first signal point and a second signal point, and the at least one shunt IDT is coupled at least between the first signal point and ground, or between the second signal point and ground. Herein, the two reflective structures, the at least one series IDT, and the at least one shunt IDT reside over the piezoelectric layer. The at least one series IDT and the at least one shunt IDT are arranged between the two reflective structures.

In one embodiment of the SAW device, the at least one shunt IDT is coupled between the first signal point and ground.

In one embodiment of the SAW device, the at least one shunt IDT is coupled between the second signal point and ground.

In one embodiment of the SAW device, the at least one shunt IDT includes a first shunt IDT and a second shunt IDT. Herein, the at least one series IDT is arranged between the first shunt IDT and the second shunt IDT.

In one embodiment of the SAW device, the at least one series IDT includes a first series IDT and a second series IDT. Herein, the at least one shunt IDT is arranged between the first series IDT and the second series IDT.

In one embodiment of the SAW device, the at least one shunt IDT includes a first shunt IDT and a second shunt IDT. Herein, the first shunt IDT is coupled between the first signal point and ground, and the second shunt IDT is coupled between the second signal point and ground.

In one embodiment of the SAW device, the at least one series IDT includes a first series IDT and a second series IDT. Herein, both the first shunt IDT and the second shunt IDT are arranged between the first series IDT and the second series IDT.

In one embodiment of the SAW device, the first shunt IDT and the second shunt IDT are arranged at one side of the at least one series IDT.

In one embodiment of the SAW device, the at least one series IDT is arranged between the first shunt IDT and the second shunt IDT.

In one embodiment of the SAW device, the at least one series IDT includes a number of series IDTs, and the at least one shunt IDT includes a number of shunt IDTs. Herein the series IDTs and the shunt IDTs are arranged alternately between the two reflective structures.

In one embodiment of the SAW device, the at least one series IDT includes a number of series IDTs, and the at least one shunt IDT includes a number of shunt IDTs. Herein, a number of the series IDTs is different from a number of the shunt IDTs.

In one embodiment of the SAW device, the at least one series IDT includes a number of series IDTs, and the at least one shunt IDT includes a number of shunt IDTs. Herein, a number of the series IDTs is the same as a number of the shunt IDTs.

In one embodiment of the SAW device, the at least one series IDT includes a number of first electrode fingers coupled to the first signal point and a number of second electrode fingers coupled to the second signal point. The at least one shunt IDT includes a number of first electrode fingers coupled to the first signal point or the second signal point, and a number of second electrode fingers to ground.

In one embodiment of the SAW device, a number of the first electrode fingers of the at least one series IDT is the same as a number of the second electrode fingers of the at least one series IDT.

In one embodiment of the SAW device, a number of the first electrode fingers of the at least one series IDT is different from a number of the second electrode fingers of the at least one series IDT.

In one embodiment of the SAW device, a number of the first electrode fingers of the at least one shunt IDT is the same as a number of the second electrode fingers of the at least one shunt IDT.

In one embodiment of the SAW device, a number of the first electrode fingers of the at least one shunt IDT is different from a number of the second electrode fingers of the at least one shunt IDT.

In one embodiment of the SAW device, the at least one series IDT includes a first series IDT and a second series IDT. Herein, the first series IDT includes a number of electrode fingers and the second series IDT includes a number of electrode fingers. Herein, a number of the electrode fingers of the first series IDT is the same as a number of the electrode fingers of the second series IDT.

In one embodiment of the SAW device, the at least one series IDT includes a first series IDT and a second series IDT. Herein, the first series IDT includes a number of electrode fingers and the second series IDT includes a number of electrode fingers. Herein, a number of the electrode fingers of the first series IDT is different from a number of the electrode fingers of the second series IDT.

According to another embodiment, a SAW device includes a piezoelectric layer, two reflective structures, a first shunt IDT, and a series IDT. The first shunt IDT is coupled between a first signal point and ground, and the series IDT is coupled between a second signal point and a third signal point. Herein, the two reflective structures, the first shunt IDT, and the series IDT reside over the piezoelectric layer. The first shunt IDT and the series IDT are arranged between the two reflective structures.

According to another embodiment, the SAW device further includes a second shunt IDT residing over the piezoelectric layer and arranged between the two reflective structures. Herein, the second shunt IDT is coupled between the second signal point and ground.

In one embodiment of the SAW device, the series IDT is arranged between the first shunt IDT and the second shunt IDT.

In one embodiment of the SAW device, the first shunt IDT and the second shunt IDT are arranged at one side of the series IDT.

According to another embodiment, SAW circuitry includes a first SAW device and a second SAW device. The first SAW device includes two first reflective structures, at least one first series IDT, and at least one first shunt IDT. The second SAW device includes two second reflective structures, at least one second series IDT, and at least one second shunt IDT. Herein, the first SAW device and the second SAW device are connected at a common point and coupled in series between a first signal point and a second signal point. The first SAW device and the second SAW device share a common piezoelectric layer. The first reflective structures, the at least one first series IDT, the at least one first shunt IDT, the second reflective structures, the at least one second series IDT, and the at least one second shunt IDT reside over the piezoelectric layer. The at least one first series IDT and the at least one first shunt IDT are arranged between the two first reflective structures, and the at least one second series IDT and the at least one second shunt IDT are arranged between the two second reflective structures. In addition, the at least one first series IDT is coupled between the first signal point and the common point, and the at least one second series IDT is coupled between the common point and the second signal point. The at least one first shunt IDT is coupled between the first signal point and ground, or between the common point and ground. The at least one second shunt IDT is coupled between the second signal point and ground, or between the common point and ground.

According to another embodiment, the SAW circuitry further includes at least one coupled resonator filter (CRF), which includes two third reflective structures, and a number of CRF IDTs. Herein, the first SAW device, the second SAW device, and the at least one CRF share the common piezoelectric layer. The CRF IDTs are arranged between the two third reflective structures. At least one of the CRF IDTs is coupled between the first signal point and ground, and at least one of the CRF IDTs is coupled between the first SAW device and ground.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 provides a perspective view illustration of a representative surface acoustic wave (SAW) resonator.

Figure 1:
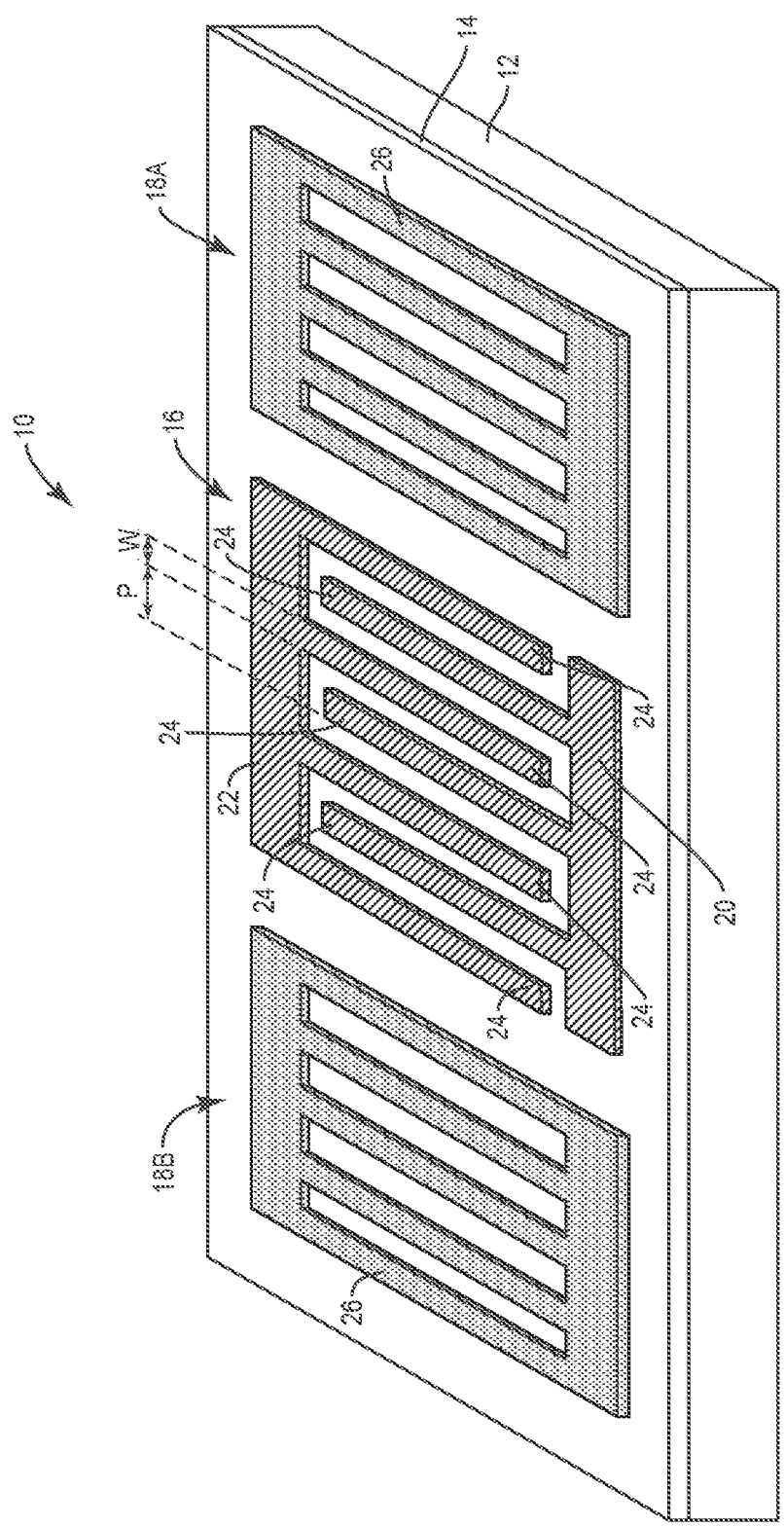

It will be understood that for clear illustrations, FIGS. 1-8B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a surface acoustic wave (SAW) device, and particularly to a ladder-type SAW device with both series and shunt interdigital transducers (IDTs). Disclosed SAW devices are described herein that provide sharp transitions between passband frequencies and frequencies that are outside of desired passbands. Before describing particular embodiments of the present disclosure further, a general discussion of SAW devices is provided. FIG. 1 provides a perspective view illustration of a representative SAW resonator 10. The SAW resonator 10 includes a substrate 12, a piezoelectric layer 14 on the substrate 12, an IDT 16 on a surface of the piezoelectric layer 14 opposite the substrate 12, and two reflective structures 18A and 18B on the surface of the piezoelectric layer 14 placed at opposite sides of the IDT 16.

The IDT 16 includes a first electrode 20 and a second electrode 22, each of which may include one or more electrode fingers 24 that are interleaved with one another as shown. The first electrode 20 and the second electrode 22 may also be referred to as comb electrodes. For the purpose of this illustration, the first electrode 20 of the IDT 16 includes three electrode fingers 24, and the second electrode 22 of the IDT 16 includes four electrode fingers 24. In different applications, the first/second electrode 20/22 may have fewer or more electrode fingers. A number of the electrode fingers 24 within the first electrode 20 and a number of the electrode fingers 24 within the second electrode 22 may be different or the same (not shown). A lateral distance between adjacent electrode fingers 24 of the first electrode 20 and the second electrode 22 defines an electrode pitch P of the IDT 16. The electrode pitch P may at least partially define a center frequency wavelength $\lambda$ of the SAW resonator 10, where the center frequency is the primary frequency of mechanical waves generated in the piezoelectric layer 14 by the IDT 16. A finger width W of the adjacent electrode fingers 24 over the electrode pitch P may define a metallization ratio, or duty factor, of the IDT 16, which may dictate certain operating characteristics of the SAW resonator 10.

In operation, an alternating electrical input signal provided at the first electrode 20 is transduced into a mechanical signal in the piezoelectric layer 14, resulting in one or more acoustic waves therein. In the case of the SAW resonator 10, the resulting acoustic waves are predominately surface acoustic waves. As discussed above, due to the electrode pitch P and the metallization ratio of the IDT 16, the characteristics of the material of the piezoelectric layer 14, and other factors, the magnitude and frequency of the acoustic waves transduced in the piezoelectric layer 14 are dependent on the frequency of the alternating electrical input signal. This frequency dependence is often described in terms of changes in the impedance and/or a phase shift between the first electrode 20 and the second electrode 22 with respect to the frequency of the alternating electrical input signal. An alternating electrical potential between the two electrodes 20 and 22 creates an electrical field in the piezoelectric material which generate acoustic waves. The acoustic waves travel at the surface and eventually are transferred back into an electrical signal between the electrodes 20 and 22. The two reflective structures 18A and 18B reflect the acoustic waves in the piezoelectric layer 14 back towards the IDT 16 to confine the acoustic waves in the area surrounding the IDT 16. Each reflective structure 18A or 18B may include one or more reflective fingers 26 (only two reflective fingers are labeled with a reference number for clarity). A number of the reflective fingers 26 within the reflective structure 18A and a number of the reflective fingers 26 within the reflective structure 18B may be different (not shown) or the same.

The substrate 12 may be formed of various materials including glass, sapphire, quartz, silicon (Si), or gallium arsenide (GaAs) among others, with Si being a common choice. The piezoelectric layer 14 may be formed of any suitable piezoelectric material(s), such as lithium tantalate (LT), or lithium niobate ($LiNbO_3$), but is not limited thereto. In certain embodiments, the piezoelectric layer 14 is thick enough or rigid enough to function as a piezoelectric substrate. Accordingly, the substrate 12 in FIG. 1 may be omitted. Those skilled in the art will appreciate that the principles of the present disclosure may apply to other materials for the substrate 12 and the piezoelectric layer 14. The IDT 16, the two reflective structures 18A and 18B may include aluminum (Al). While not shown to avoid obscuring the drawings, additional passivation layers, frequency trimming layers, or any other layers may be provided over all or a portion of the exposed surface of the piezoelectric layer 14, the IDT 16, and the two reflective structures 18A and 18B.

Further, one or more layers may be provided between the substrate 12 and the piezoelectric layer 14 in some embodiments.

Figure 2A:
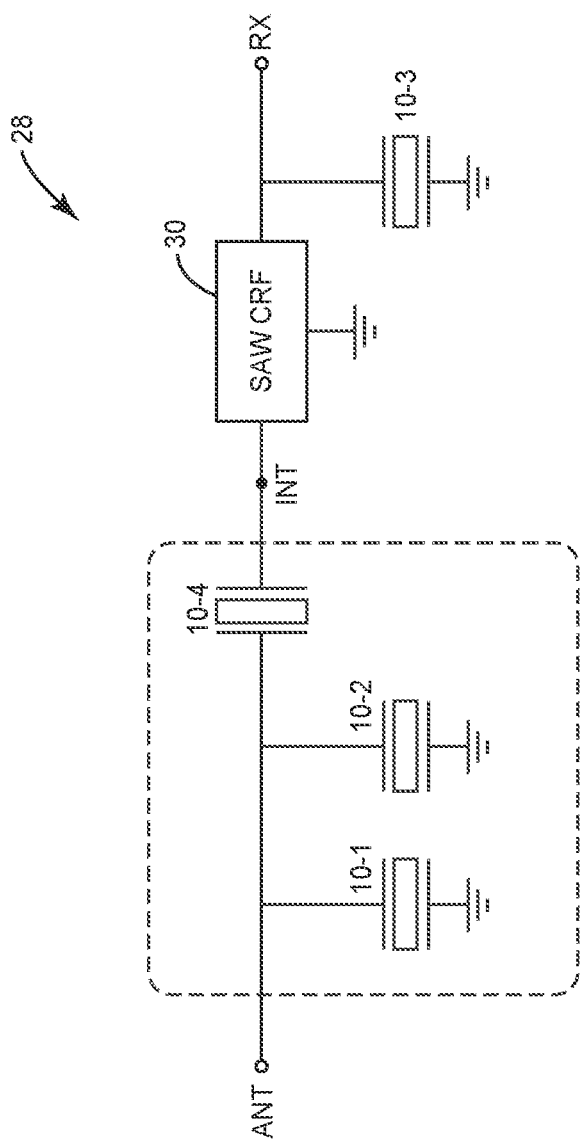
FIGS. 2A and 2B show a receiver (RX) filter that includes multiple SAW resonators.
Figure 2B:
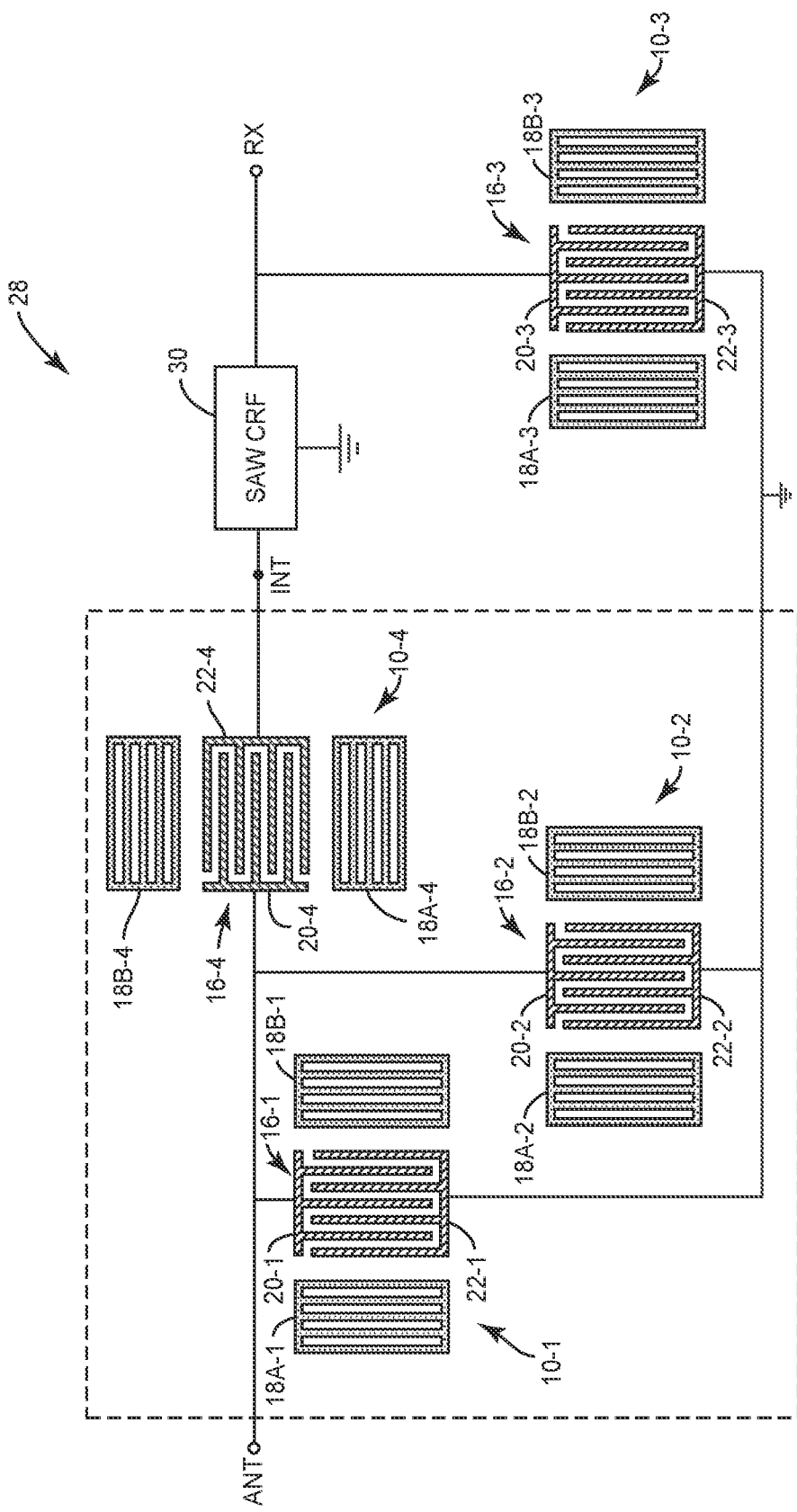

FIGS. 2A and 2B show a receiver (RX) filter 28 that includes multiple SAW resonators 10. The RX filter includes an antenna (ANT) point, an intermediate (INT) point, an RX point, a first shunt SAW resonator 10-1, a second shunt SAW resonator 10-2, a third shunt SAW resonator 10-3, a series SAW resonator 10-4, and a SAW coupled resonator filter (CRF) 30. Herein, the first shunt SAW resonator 10-1, the second shunt SAW resonator 10-2, the third shunt SAW resonator 10-3, the series SAW resonator 10-4, and the SAW CRF 30 share a common piezoelectric layer (not shown). In addition, each of the first shunt SAW resonator 10-1, the second shunt SAW resonator 10-2, the third shunt SAW resonator 10-3, and the series SAW resonator 10-4 may have a same configuration as the SAW resonator 10 shown in FIG. 1, and includes a corresponding IDT (16-1/16-2/16-3/16-4) with corresponding electrodes (20-1 and 22-1/20-2 and 22-2/20-3 and 22-3/20-4 and 22-4) and corresponding reflective structures (18A-1 and 18B-1/18A-2 and 18B-2/18A-3 and 18B-3/18A-4 and 18B-4).

The first shunt SAW resonator 10-1 and the second shunt SAW resonator 10-2 are parallel to each other and both coupled between the ANT point and ground. The third shunt SAW resonator 10-3 is coupled between the RX point and ground. The series SAW resonator 10-4 is coupled between the ANT point and the INT point. The SAW CRF 30 is coupled between the INT point and the RX point, and also coupled to ground. The first shunt SAW resonator 10-1 and the second shunt SAW resonator 10-2 refer to split shunt resonators, which will accommodate higher power than and will provide better linearity than a single shunt SAW resonator (10-1 or 10-2) coupled between the ANT point and ground. However, both the first shunt SAW resonator 10-1 and the second shunt SAW resonator 10-2 include reflective structures (18A-1 and 18B-1/18A-2 and 18B-2/), which will occupy a relatively large area. In some applications, the RX filter 28 may include two or more series SAW resonators coupled in series between the ANT point and the INT point without a shunt SAW resonator in between (not shown). These two or more series SAW resonators refer to split series resonators, which may also accommodate higher power than and may provide better linearity than a single series SAW resonator 10-4 coupled between the ANT point and the INT point. However, more split series resonators require more areas.

Figure 3:
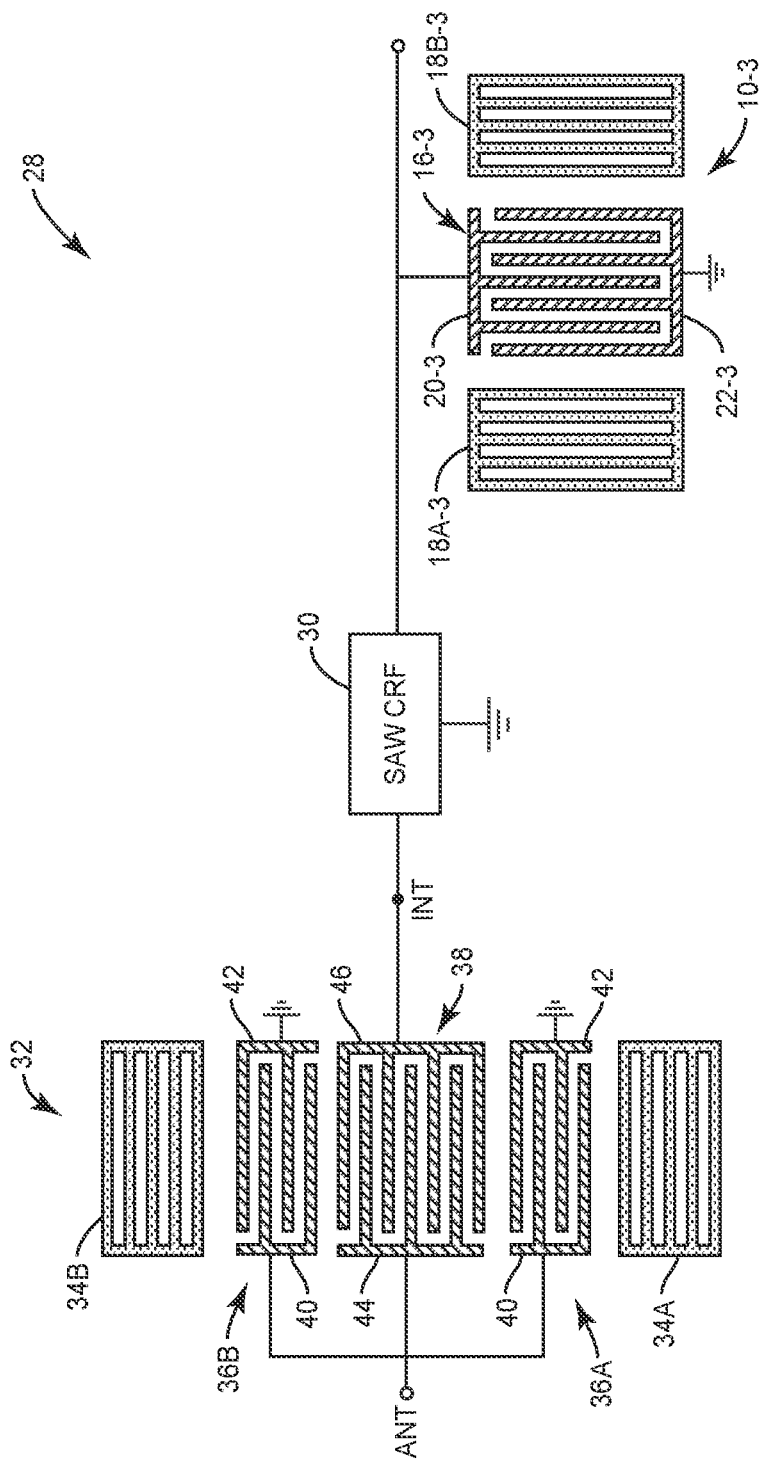
FIG. 3 shows an RX filter that includes a ladder-type SAW device with both series and shunt interdigital transducers (IDTs).

To reduce the die size and maintain the power and linearity performances, a ladder-type SAW device 32 with both series and shunt IDTs is proposed to replace the first shunt SAW resonator 10-1, the second shunt SAW resonator 10-2, and the series SAW resonator 10-4 (within the dashed box shown in FIGS. 2A and 2B) in the RX filter 28, as illustrated in FIG. 3. The ladder-type SAW device 32 includes two reflective structures 34A and 34B, two first shunt IDTs 36A and 36B, and a first series IDT 38, all of which reside on a common piezoelectric layer (not shown). Herein, each first shunt IDT 36A/36B is coupled between the ANT point and ground. The first series IDT 38 is coupled between the ANT point and the INT point. In one embodiment, the two first shunt IDTs 36A and 36B are identical and placed symmetrically at opposite sides of the first series IDT 38. The first shunt IDTs 36A and 36B, and the first series IDT 38 are arranged between the two reflective structures 34A and 34B.

For the purpose of this illustration, each reflective structure 34A/34B includes five reflective fingers. Each first shunt IDT 36A/36B includes a first electrode 40 that is coupled to the ANT point and has two electrode fingers, and a second electrode 42 that is coupled to ground and has two electrode fingers. The first series IDT 38 includes a first electrode 44 that is coupled to the ANT point and has three electrode fingers, and a second electrode 46 that is coupled to the INT point and has four electrode fingers. In different applications, each reflective structure 34A or 34B may have fewer or more reflective fingers. The first and second electrodes 40 and 42 of each first shunt IDT 36A or 36B may have fewer or more electrode fingers. The first and second electrodes 44 and 46 of the first series IDT 38 may have fewer or more electrode fingers.

The ladder-type SAW device 32 shown in FIG. 3 operates a same function as the resonator combination of the first shunt SAW resonator 10-1, the second shunt SAW resonator 10-2, and the series SAW resonator 10-4 shown in the dashed box of FIG. 2B. However, since the ladder-type SAW device 32 only includes one pair of reflective structures 34A and 34B instead of three pairs in the resonator combination, the ladder-type SAW device 32 has a much smaller size than the resonator combination. In addition, the first shunt IDTs 36A and 36B of the ladder-type SAW device 32 have fewer electrode fingers than the first shunt SAW resonator 10-1 and the second shunt SAW resonator 10-2. As such, the ladder-type SAW device 32 may shrink in size further and have better passband edge insertion loss performance. For the ladder-type SAW device 32, the first shunt IDTs 36A and 36B, and the first series IDT 38 are placed in a same acoustic cavity and use the acoustic coupling in between. As such, even with fewer electrode fingers in the first shunt IDTs 36A and 36B than the first shunt SAW resonator 10-1 and the second shunt SAW resonator 10-2, the ladder-type SAW device 32 may still obtain superior steepness of the passband.

Figure 4A:
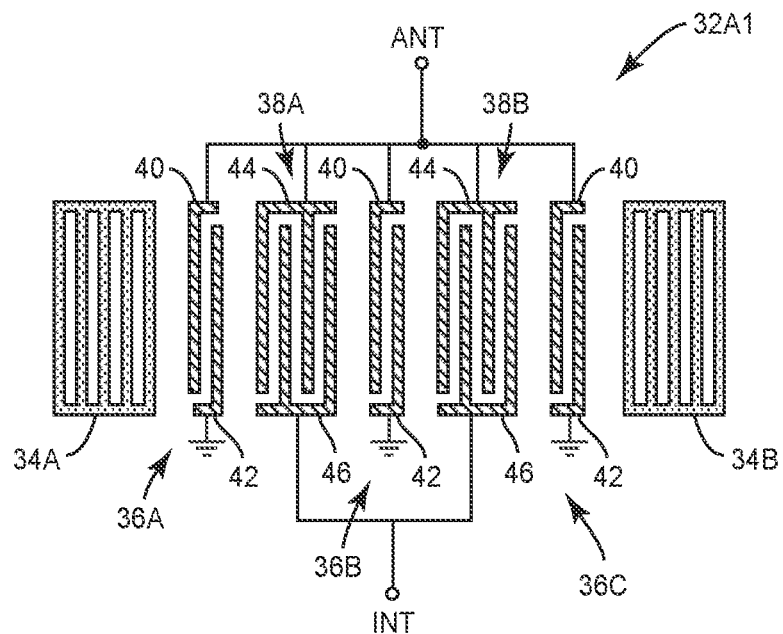
FIGS. 4A-4F show alternative ladder-type SAW devices with both series and shunt IDTs.

FIGS. 4A-4F show alternative ladder-type SAW devices, each of which may replace the ladder-type SAW device 32 in the RX filter 28. A first alternative ladder-type SAW device 32A1 includes the reflective structures 34A and 34B, three first shunt IDTs 36A, 36B, and 36C, and two first series IDTs 38A and 38B, as illustrated in FIG. 4A. Herein, each first shunt IDT 36A/36B/36C is coupled between the ANT point and ground. Each first series IDT 38A/38B is coupled between the ANT point and the INT point. In one embodiment, the three first shunt IDTs 36A, 36B, and 36C are identical, and the two first series IDTs 38A and 38B are identical. The three first shunt IDTs 36A, 36B, and 36C and the two first series IDTs 38A and 38B are arranged alternately between the two reflective structures 34A and 34B. For the purpose of this illustration, the first electrode 40 of each first shunt IDT 36A/36B/36C is coupled to the ANT point and includes one electrode finger, and the second electrode 42 of each first shunt IDT 36A/36B/36C is coupled to ground and includes one electrode finger. The first electrode 44 of each first series IDT 38A/38B is coupled to the ANT point and includes two electrode fingers, and the second electrode 46 of each first series IDT 38A/38B is coupled to the INT point and includes two electrode fingers. In different applications, the first and second electrodes 40 and 42 of each first shunt IDT 36A/36B/36C may have more electrode fingers. The first and second electrodes 44 and 46 of each first series IDT 38A/38B may have fewer or more electrode fingers.

Figure 4B:
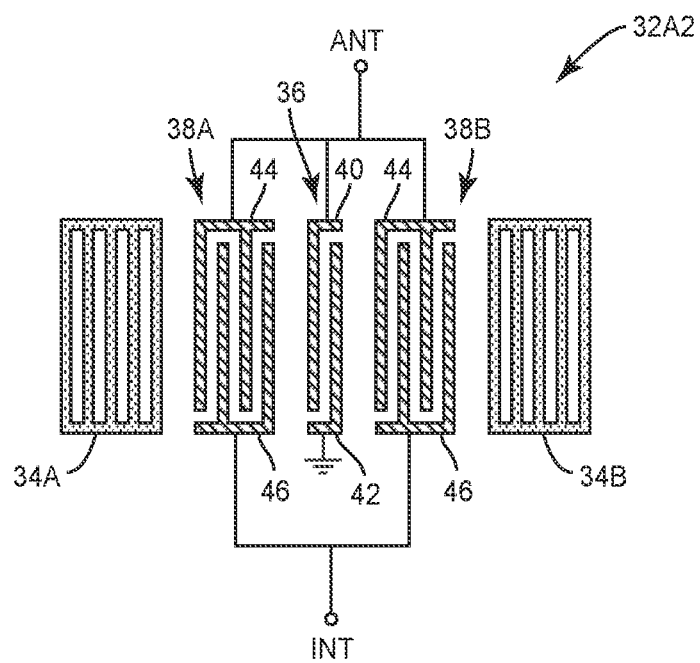

A second alternative ladder-type SAW device 32A2 includes the reflective structures 34A and 34B, one first shunt IDT 36, and the two first series IDTs 38A and 38B, as illustrated in FIG. 4B. Herein, the first shunt IDT 36 is coupled between the ANT point and ground. Each first series IDT 38A/38B is coupled between the ANT point and the INT point. In one embodiment, the two first series IDTs 38A and 38B are identical and placed symmetrically at opposite sides of the first shunt IDT 36. The first shunt IDT 36 and the first series IDTs 38A and 38B are arranged between the two reflective structures 34A and 34B. For the purpose of this illustration, the first electrode 40 of the first shunt IDT 36 is coupled to the ANT point and includes one electrode finger, and the second electrode 42 of the first shunt IDT 36 is coupled to ground and includes one electrode finger. The first electrode 44 of each first series IDT 38A/38B is coupled to the ANT point and includes two electrode fingers, and the second electrode 46 of each first series IDT 38A/38B is coupled to the INT point and includes two electrode fingers. In different applications, the first and second electrodes 40 and 42 of the first shunt IDT 36 may have more electrode fingers. The first and second electrodes 44 and 46 of each first series IDT 38A/38B may have fewer or more electrode fingers.

Figure 4C:
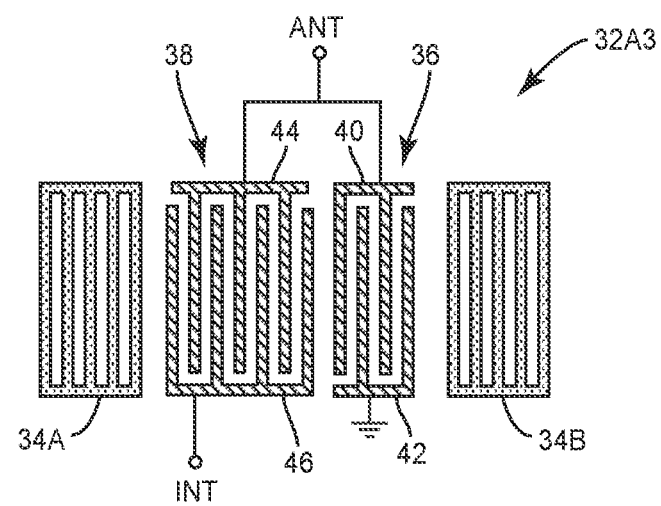

A third alternative ladder-type SAW device 32A3 includes the reflective structures 34A and 34B, one first shunt IDT 36, and one first series IDT 38, as illustrated in FIG. 4C. Herein, the first shunt IDT 36 is coupled between the ANT point and ground, and the first series IDT 38 is coupled between the ANT point and the INT point. The first shunt IDT 36 and the first series IDT 38 are arranged between the two reflective structures 34A and 34B. For the purpose of this illustration, the first electrode 40 of the first shunt IDT 36 is coupled to the ANT point and includes two electrode fingers, and the second electrode 42 of the first shunt IDT 36 is coupled to ground and includes two electrode fingers. The first electrode 44 of the first series IDT 38 is coupled to the ANT point and includes three electrode fingers, and the second electrode 46 of the first series IDT 38 is coupled to the INT point and includes four electrode fingers. In different applications, the first and second electrodes 40 and 42 of the first shunt IDT 36 may have fewer or more electrode fingers. The first and second electrodes 44 and 46 of the first series IDT 38 may have fewer or more electrode fingers.

Figure 4D:
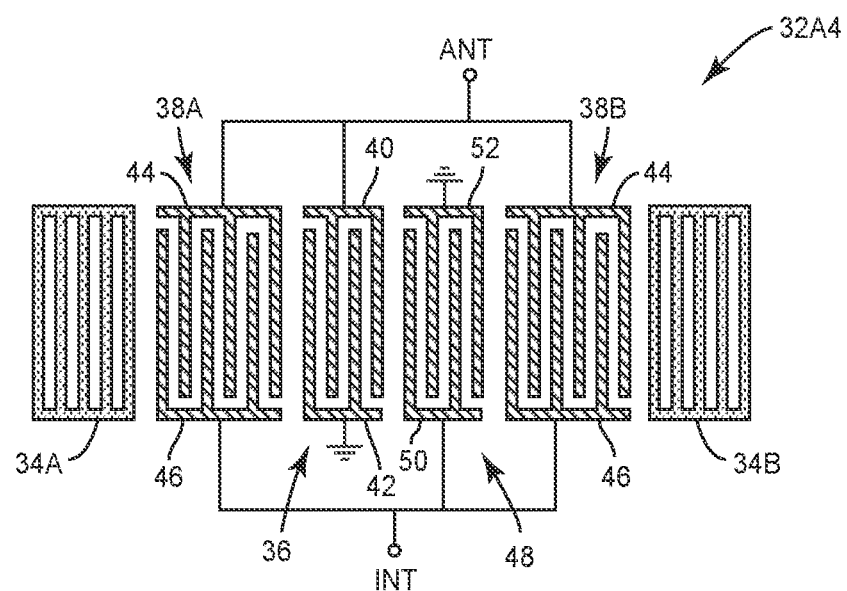

A fourth alternative ladder-type SAW device 32A4 includes the reflective structures 34A and 34B, one first shunt IDT 36, two first series IDT 38A and 38B, and one second shunt IDT 48, as illustrated in FIG. 4D. Herein, the first shunt IDT 36 is coupled between the ANT point and ground. Each first series IDT 38A/38B is coupled between the ANT point and the INT point. The second shunt IDT 48 is coupled between ground and the INT point. In one embodiment, the first shunt IDT 36 and the second shunt IDT 48 are arranged between the two first series IDTs 38A and 38B. The first shunt IDT 36, the second shunt IDT 48, and the first series IDTs 38A and 38B are arranged between the two reflective structures 34A and 34B. For the purpose of this illustration, the first electrode 40 of the first shunt IDT 36 is coupled to the ANT point and includes two electrode fingers, and the second electrode 42 of the first shunt IDT 36 is coupled to ground and includes two electrode fingers. The first electrode 44 of each first series IDT 38A/38B is coupled to the ANT point and includes three electrode fingers, and the second electrode 46 of each first series IDT 38A/38B is coupled to the INT point and includes three electrode fingers. A first electrode 50 of the second shunt IDT 48 is coupled to the INT point and includes two electrode fingers, and a second electrode 52 of the second shunt IDT 48 is coupled to ground and includes two electrode fingers. In different applications, the first and second electrodes 40 and 42 of the first shunt IDT 36 may have fewer or more electrode fingers. The first and second electrodes 44 and 46 of each first series IDT 38A/38B may have fewer or more electrode fingers. The first and second electrodes 50 and 52 of the second shunt IDT 48 may have fewer or more electrode fingers.

Figure 4E:
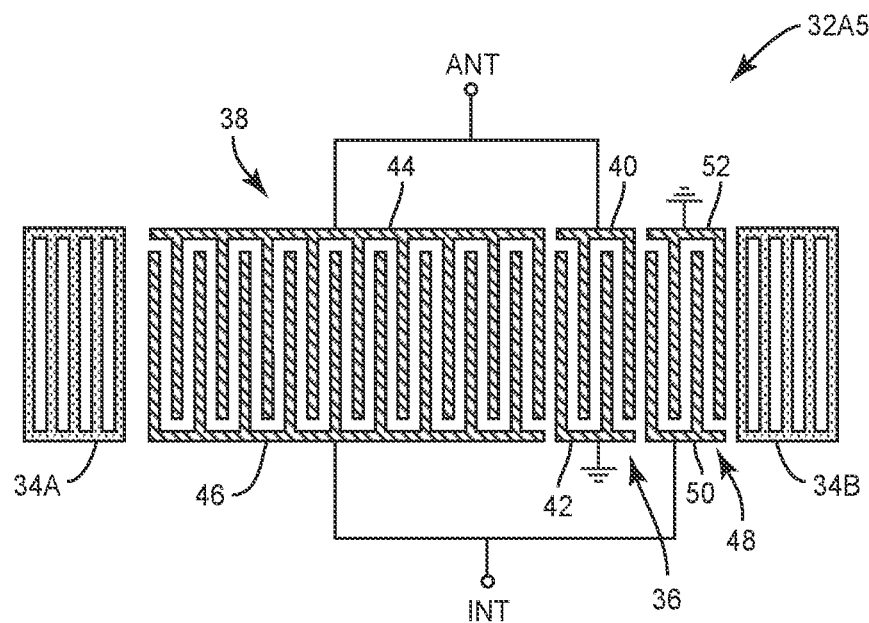

A fifth alternative ladder-type SAW device 32A5 includes the reflective structures 34A and 34B, one first shunt IDT 36, one first series IDT 38, and one second shunt IDT 48, as illustrated in FIG. 4E. Herein, the first shunt IDT 36 is coupled between the ANT point and ground. The first series IDT 38 is coupled between the ANT point and the INT point. The second shunt IDT 48 is coupled between ground and the INT point. In one embodiment, the first shunt IDT 36 and the second shunt IDT 48 are arranged at a same side of the first series IDT 38. The first shunt IDT 36, the second shunt IDT 48, and the first series IDT 38 are arranged between the two reflective structures 34A and 34B. For the purpose of this illustration, the first electrode 40 of the first shunt IDT 36 is coupled to the ANT point and includes two electrode fingers, and the second electrode 42 of the first shunt IDT 36 is coupled to ground and includes two electrode fingers. The first electrode 44 of the first series IDT 38 is coupled to the ANT point and includes nine electrode fingers, and the second electrode 46 of the first series IDT 38 is coupled to the INT point and includes nine electrode fingers. The first electrode 50 of the second shunt IDT 48 is coupled to the INT point and includes two electrode fingers, and the second electrode 52 of the second shunt IDT 48 is coupled to ground and includes two electrode fingers. In different applications, the first and second electrodes 40 and 42 of the first shunt IDT 36 may have fewer or more electrode fingers. The first and second electrodes 44 and 46 of the first series IDT 38 may have fewer or more electrode fingers. The first and second electrodes 50 and 52 of the second shunt IDT 48 may have fewer or more electrode fingers.

Figure 4F:
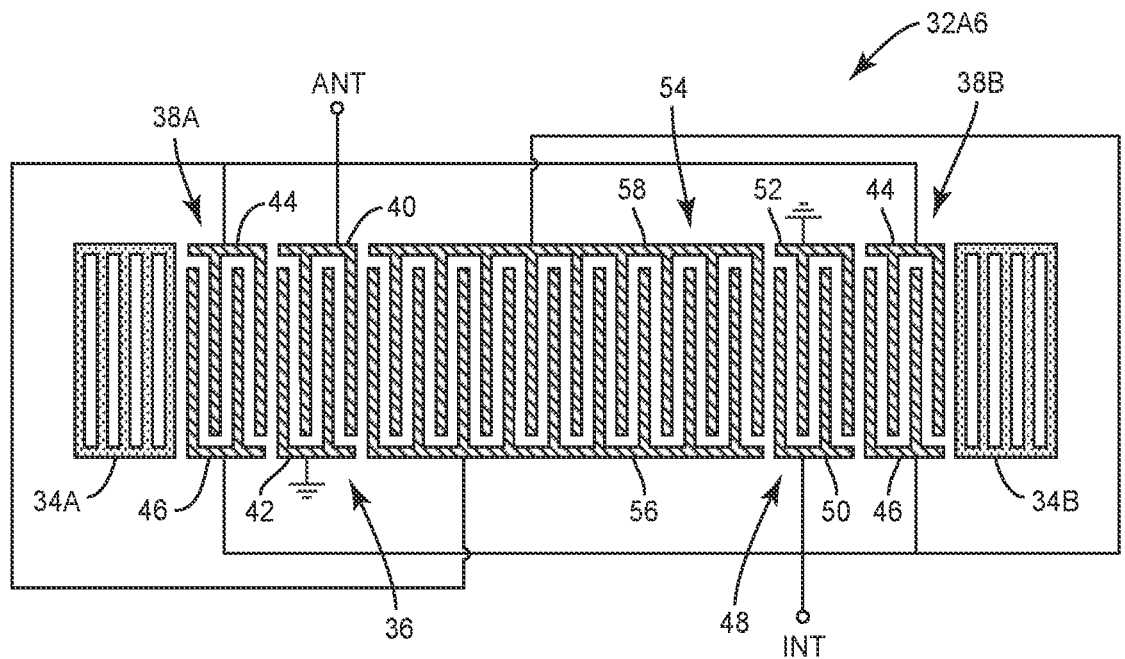

A sixth alternative ladder-type SAW device 32A6 includes the reflective structures 34A and 34B, one first shunt IDT 36, two first series IDTs 38A and 38B, one second shunt IDT 48, and one second series IDT 54, as illustrated in FIG. 4F. Herein, the first shunt IDT 36 is coupled between the ANT point and ground, and the second shunt IDT 48 is coupled between ground and the INT point. Each series IDT 38A/38B/54 is coupled between the ANT point and the INT point. The second series IDT 54 is arranged between the first and second shunt IDTs 36 and 48. The first shunt IDT 36, the second shunt IDT 48, and the second series IDT 54 are arranged between the two first series IDTs 38A and 38B. The first shunt IDT 36, the second shunt IDT 48, the first series IDTs 38A and 38B, and the second series IDT 54 are arranged between the two reflective structures 34A and 34B.

For the purpose of this illustration, the first electrode 40 of the first shunt IDT 36 is coupled to the ANT point and includes two electrode fingers, and the second electrode 42 of the first shunt IDT 36 is coupled to ground and includes two electrode fingers. The first electrode 44 of each first series IDT 38A/38B is coupled to the ANT point and includes two electrode fingers, and the second electrode 46 of each first series IDT 38A/38B is coupled to the INT point and includes two electrode fingers. The first electrode 50 of the second shunt IDT 48 is coupled to the INT point and includes two electrode fingers, and the second electrode 52 of the second shunt IDT 48 is coupled to ground and includes two electrode fingers. A first electrode 56 of the second series IDT 54 is coupled to the ANT point and includes nine electrode fingers, and a second electrode 58 of the second series IDT 54 is coupled to the INT point and includes nine electrode fingers. Notice that the first electrode 44 of each first series IDT 38A/38B is placed in a reversed (upside-down) position to the first electrode 56 of the second series IDT 54, and the second electrode 46 of each first series IDT 38A/38B is placed in a reversed (upside-down) position to the second electrode 58 of the second series IDT 54. In different applications, the first and second electrodes 40 and 42 of the first shunt IDT 36 may have fewer or more electrode fingers. The first and second electrodes 44 and 46 of each first series IDT 38A/38B may have fewer or more electrode fingers. The first and second electrodes 50 and 52 of the second shunt IDT 48 may have fewer or more electrode fingers. The first and second electrodes 56 and 58 of the second series IDT 54 may have fewer or more electrode fingers.

Figure 5A:
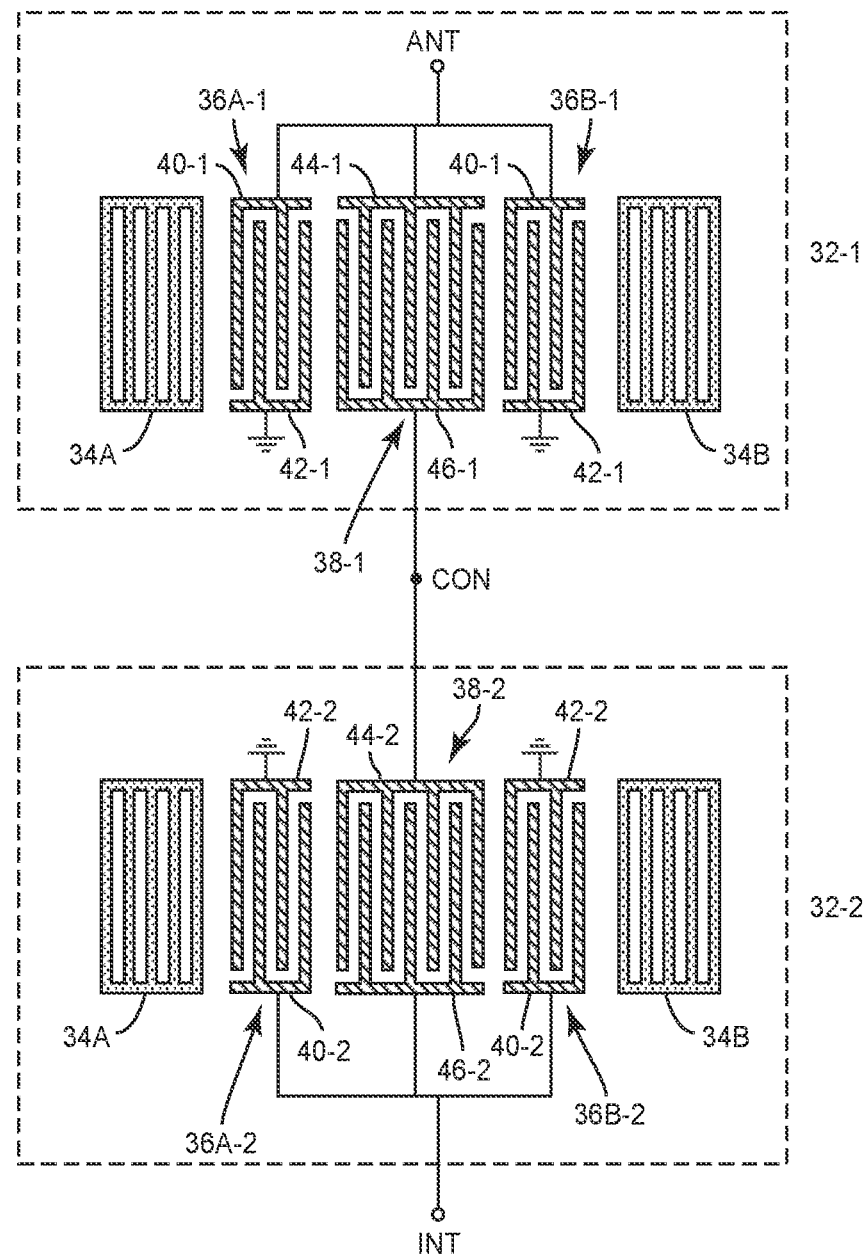
FIGS. 5A-5D show multiple ladder-type SAW devices included in the RX filter.

In some applications, there may be more than one ladder-type SAW device included in the RX filter and coupled between the ANT point and the INT point, as illustrated in FIGS. 5A-5D. In FIG. 5A, there are a first ladder-type SAW device 32-1 and a second ladder-type SAW device 32-2 coupled in series between the ANT point and the INT point. The first ladder-type SAW device 32-1 and the second ladder-type SAW device 32-2 are connected at a connection (CON) point. The first ladder-type SAW device 32-1 includes two reflective structures 34A and 34B, two first shunt IDTs 36A-1 and 36B-1, and one first series IDT 38-1. Herein, each first shunt IDT 36A-1/36B-1 is coupled between the ANT point and ground. The first series IDT 38-1 is coupled between the ANT point and the CON point. In detail, a first electrode 40-1 of each first shunt IDT 36A-1/36B-1 and a first electrode 44-1 of the first series IDT 38-1 are coupled to the ANT point, a second electrode 42-1 of each first shunt IDT 36A-1/36B-1 is coupled to ground, and a second electrode 46-1 of the first series IDT 38-1 is coupled to the CON point. The second ladder-type SAW device 32-2 includes the two reflective structures 34A and 34B, two first shunt IDTs 36A-2 and 36B-2, and one first series IDT 38-2. Herein, each first shunt IDTs 36A-2 or 36B-2 is coupled between the INT point and ground. The first series IDT 38-2 is coupled between the CON point and the INT point. In detail, a first electrode 44-2 of the first series IDT 38-2 is coupled to the CON point, a first electrode 40-2 of each first shunt IDT 36A-2/36B-2 and a second electrode 46-2 of the first series IDT 38-2 are coupled to the INT point, and a second electrode 42-2 of each first shunt IDT 36A-2/36B-2 is coupled to ground.

For the first ladder-type SAW device 32-1, the two first shunt IDTs 36A-1 and 36B-1 are identical and placed symmetrically at opposite sides of the first series IDT 38-1. For the second ladder-type SAW device 32-2, the two first shunt IDTs 36A-2 and 36B-2 are identical and placed symmetrically at opposite sides of the first series IDT 38-2.

Figure 5B:
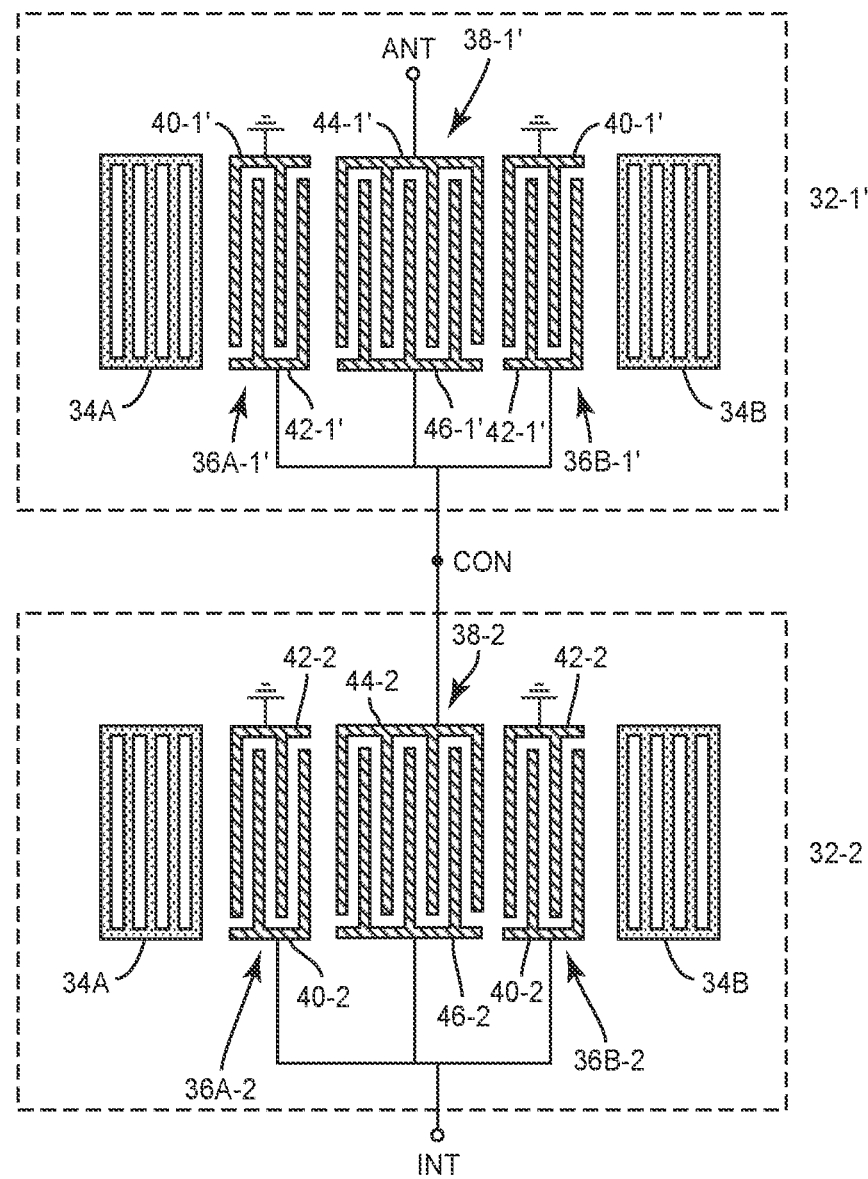

In FIG. 5B, there are a first ladder-type SAW device 32-1' and the second ladder-type SAW device 32-2 coupled in series between the ANT point and the INT point. The first ladder-type SAW device 32-1' and the second ladder-type SAW device 32-2 are connected at the CON point. The first ladder-type SAW device 32-1' includes the two reflective structures 34A and 34B, two first shunt IDTs 36A-1' and 36B-1', and one first series IDT 38-1'. Herein, each first shunt IDT 36A-1'/36B-1' is coupled between the CON point and ground. The first series IDT 38-1' is coupled between the ANT point and the CON point. In detail, a first electrode 44-1' of the first series IDT 38-1' is coupled to the ANT point, a first electrode 40-1' of each first shunt IDT 36A-1'/36B-1' and a second electrode 46-1' of the first series IDT 38-1' are coupled to the CON point, and a second electrode 42-1' of each first shunt IDT 36A-1'/36B-1' is coupled to ground. The second ladder-type SAW device 32-2 includes the two reflective structures 34A and 34B, two first shunt IDTs 36A-2 and 36B-2, and one first series IDT 38-2. Herein, each first shunt IDTs 36A-2/36B-2 is coupled between the INT point and ground. The first series IDT 38-2 is coupled between the CON point and the INT point. In detail, the first electrode 44-2 of the first series IDT 38-2 is coupled to the CON point, the first electrode 40-2 of each first shunt IDT 36A-2/36B-2 and the second electrode 46-2 of the first series IDT 38-2 are coupled to the INT point, and the second electrode 42-2 of each first shunt IDT 36A-2/36B-2 is coupled to ground.

For the first ladder-type SAW device 32-1', the two first shunt IDTs 36A-1' and 36B-1' are identical and placed symmetrically at opposite sides of the first series IDT 38-1'. For the second ladder-type SAW device 32-2, the two first shunt IDTs 36A-2 and 36B-2 are identical and placed symmetrically at opposite sides of the first series IDT 38-2.

Figure 5C:
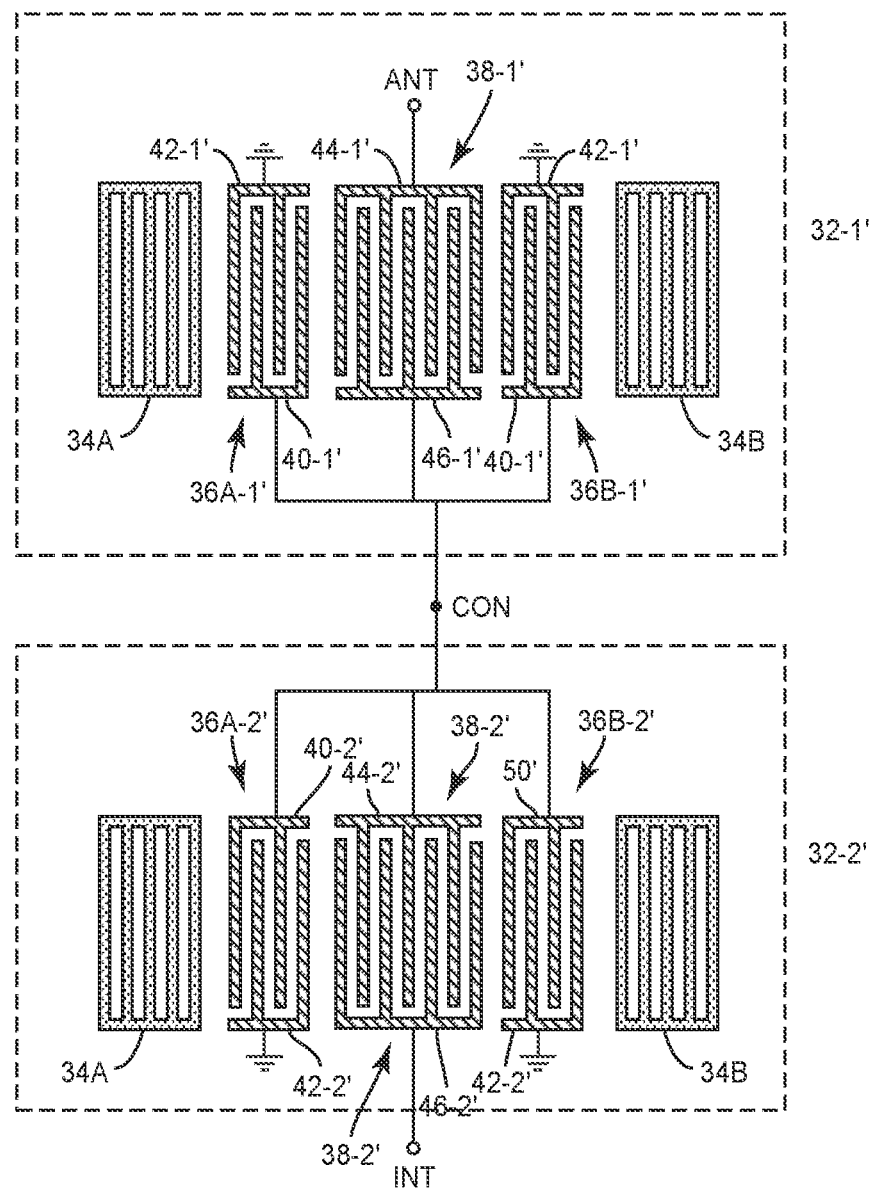

In FIG. 5C, there are the first ladder-type SAW device 32-1' and a second ladder-type SAW device 32-2' coupled in series between the ANT point and the INT point. The first ladder-type SAW device 32-1' and the second ladder-type SAW device 32-2' are connected at the CON point. The first ladder-type SAW device 32-1' includes the two reflective structures 34A and 34B, two first shunt IDTs 36A-1' and 36B-1', and one first series IDT 38-1'. Herein, each first shunt IDT 36A-1'/36B-1' is coupled between the CON point and ground. The first series IDT 38-1' is coupled between the ANT point and the CON point. In detail, the first electrode 44-1' of the first series IDT 38-1' is coupled to the ANT point, the first electrode 40-1' of each first shunt IDT 36A-1'/36B-1' and the second electrode 46-1' of the first series IDT 38-1' are coupled to the CON point, and the second electrode 42-1' of each first shunt IDT 36A-1'/36B-1' is coupled to ground. The second ladder-type SAW device 32-2' includes the two reflective structures 34A and 34B, two first shunt IDTs 36A-2' and 36B-2', and one first series IDT 38-2'. Herein, each first shunt IDT 36A-2'/36B-2' is coupled between the CON point and ground. The first series IDT 38-2' is coupled between the CON point and the INT point. In detail, a first electrode 40-2' of each first shunt IDT 36A-2' or 36B-2' and a first electrode 44-2' of the first series IDT 38-2' are coupled to the CON point, a second electrode 46-2' of the first series IDT 38-2' is coupled to the INT point, and a second electrode 42-2' of each first shunt IDT 36A-2'/36B-2' is coupled to ground.

For the first ladder-type SAW device 32-1', the two first shunt IDTs 36A-1' and 36B-1' are identical and placed symmetrically at opposite sides of the first series IDT 38-1'. For the second ladder-type SAW device 32-2', the two first shunt IDTs 36A-2' and 36B-2' are identical and placed symmetrically at opposite sides of the first series IDT 38-2'.

Figure 5D:
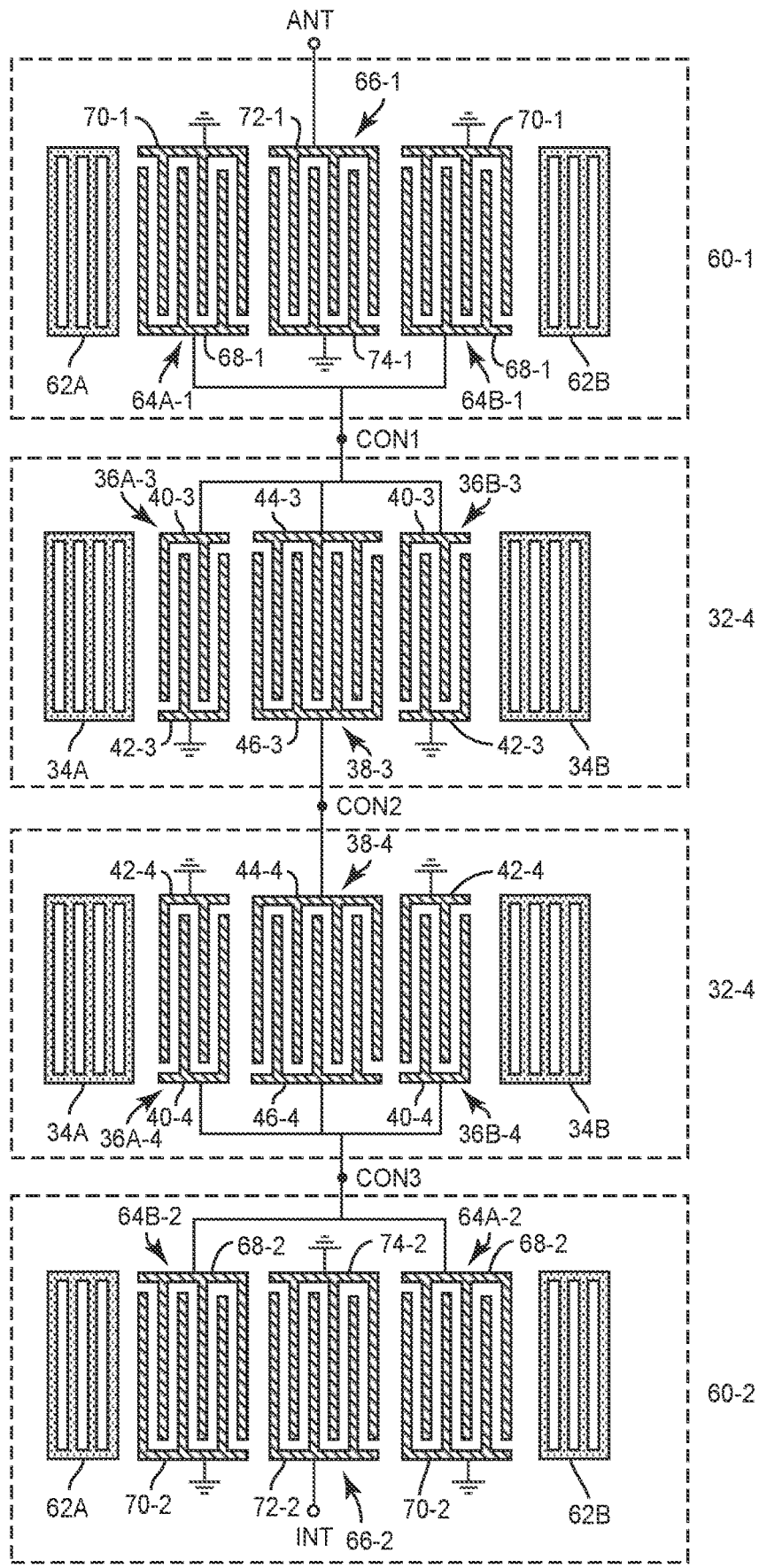

Besides the ladder-type SAW devices, there may be one or more SAW CRF coupled in series between the ANT point and the INT point, as shown in FIG. 5D. For the purpose of this illustration, there are a first SAW CRF 60-1, a third ladder-type SAW device 32-3, a fourth ladder-type SAW device 32-4, and a second SAW CRF 60-2 coupled in series between the ANT point and the INT point. In one embodiment, the first SAW CRF 60-1 is coupled between the ANT point and the third ladder-type SAW device 32-3 at a first connection (CON1) point, the third ladder-type SAW device 32-3 is coupled between the first SAW CRF 60-1 and the fourth ladder-type SAW device 32-4 at a second connection (CON2) point, and the second SAW CRF 60-2 is coupled between the INT point and the fourth ladder-type SAW device 32-4 at a third connection (CON3) point.

The first SAW CRF 60-1 includes two reflective structures 62A and 62B, two first shunt IDTs 64A-1 and 64B-1, and a second shunt IDT 66-1. The two first shunt IDTs 64A-1 and 64B-1 are identical and placed symmetrically at opposite sides of the second shunt IDT 66-1. The first shunt IDTs 64A-1 and 64B-1, and the second shunt IDT 66-1 are arranged between the two reflective structures 62A and 62B. Each reflective structure 62A/62B includes four reflective fingers. Each first shunt IDT 64A-1 or 64B-1 includes a first electrode 68-1 and a second electrode 70-1. The first electrode 68-1 is coupled to the CON1 point and has three electrode fingers, and the second electrode 70-1 is coupled to ground and has three electrode fingers. The second shunt IDT 66-1 includes a first electrode 72-1 that is coupled to the ANT point and has three electrode fingers, and a second electrode 74-1 that is coupled to ground and has three electrode fingers. In different applications, each reflective structure 62A/62B may have fewer or more reflective fingers. The first and second electrodes 68-1 and 70-1 of each first shunt IDT 64A-1 or 64B-1 may have fewer or more electrode fingers. The first and second electrodes 72-1 and 74-1 of the second shunt IDT 66-1 may have fewer or more electrode fingers.

The third ladder-type SAW device 32-3 includes two reflective structures 34A and 34B, two first shunt IDTs 36A-3 and 36B-3, and one first series IDT 38-3. The two first shunt IDTs 36A-3 and 36B-3 are identical and placed symmetrically at opposite sides of the first series IDT 38-3. The first shunt IDTs 36A-3 and 36B-3, and the first series IDT 38-3 are arranged between the two reflective structures 34A and 34B. Each reflective structure 34A and 34B includes five reflective fingers. Each first shunt IDT 36A-3/36B-3 includes a first electrode 40-3 and a second electrode 42-3. The first electrode 40-3 is coupled to the CON1 point and has two electrode fingers, and the second electrode 42-3 is coupled to ground and has two electrode fingers. The first series IDT 38-3 includes a first electrode 44-3 that is coupled to the CON1 point and has three electrode fingers, and a second electrode 46-3 that is coupled to the CON2 and has four electrode fingers. In different applications, the first and second electrodes 40-3 and 42-3 of each first shunt IDT 36A-3/36B-3 may have fewer or more electrode fingers. The first and second electrodes 44-3 and 46-3 of the first series IDT 38-3 may have fewer or more electrode fingers.

The fourth ladder-type SAW device 32-4 includes the two reflective structures 34A and 34B, two first shunt IDTs 36A-4 and 36B-4, and one first series IDT 38-4. The two first shunt IDTs 36A-4 and 36B-4 are identical and placed symmetrically at opposite sides of the first series IDT 38-4. The first shunt IDTs 36A-4 and 36B-4, and the first series IDT 38-4 are arranged between the two reflective structures 34A and 34B. Each first shunt IDT 36A-4/36B-4 includes a first electrode 40-4 and a second electrode 42-4. The first electrode 40-4 is coupled to the CON3 point and has two electrode fingers, and the second electrode 42-4 is coupled to ground and has two electrode fingers. The first series IDT 38-4 includes a first electrode 44-4 that is coupled to the CON2 point and has four electrode fingers, and a second electrode 46-4 that is coupled to the CON3 and has three electrode fingers. In different applications, the first and second electrodes 40-4 and 42-4 of each first shunt IDT 36A-4/36B-4 may have fewer or more electrode fingers. The first and second electrodes 44-4 and 46-4 of the first series IDT 38-4 may have fewer or more electrode fingers.

The second SAW CRF 60-2 includes the two reflective structures 62A and 62B, two first shunt IDTs 64A-2 and 64B-2, and one second shunt IDT 66-2. The two first shunt IDTs 64A-2 and 64B-2 are identical and placed symmetrically at opposite sides of the second shunt IDT 66-2. The first shunt IDTs 64A-2 and 64B-2, and the second shunt IDT 66-2 are arranged between the two reflective structures 62A and 62B. Each first shunt IDT 64A-2/64B-2 includes a first electrode 68-2 and a second electrode 70-2. The first electrode 68-2 is coupled to the CON3 point and has three electrode fingers, and the second electrode 70-2 is coupled to ground and has three electrode fingers. The second shunt IDT 66-2 includes a first electrode 72-2 that is coupled to the INT point and has three electrode fingers, and a second electrode 74-2 that is coupled to ground and has three electrode fingers. In different applications, the first and second electrodes 68-2 and 70-2 of each first shunt IDT 64A-2 or 64B-2 may have fewer or more electrode fingers. The first and second electrodes 72-2 and 74-2 of the second shunt IDT 66-1 may have fewer or more electrode fingers.

Figure 6:
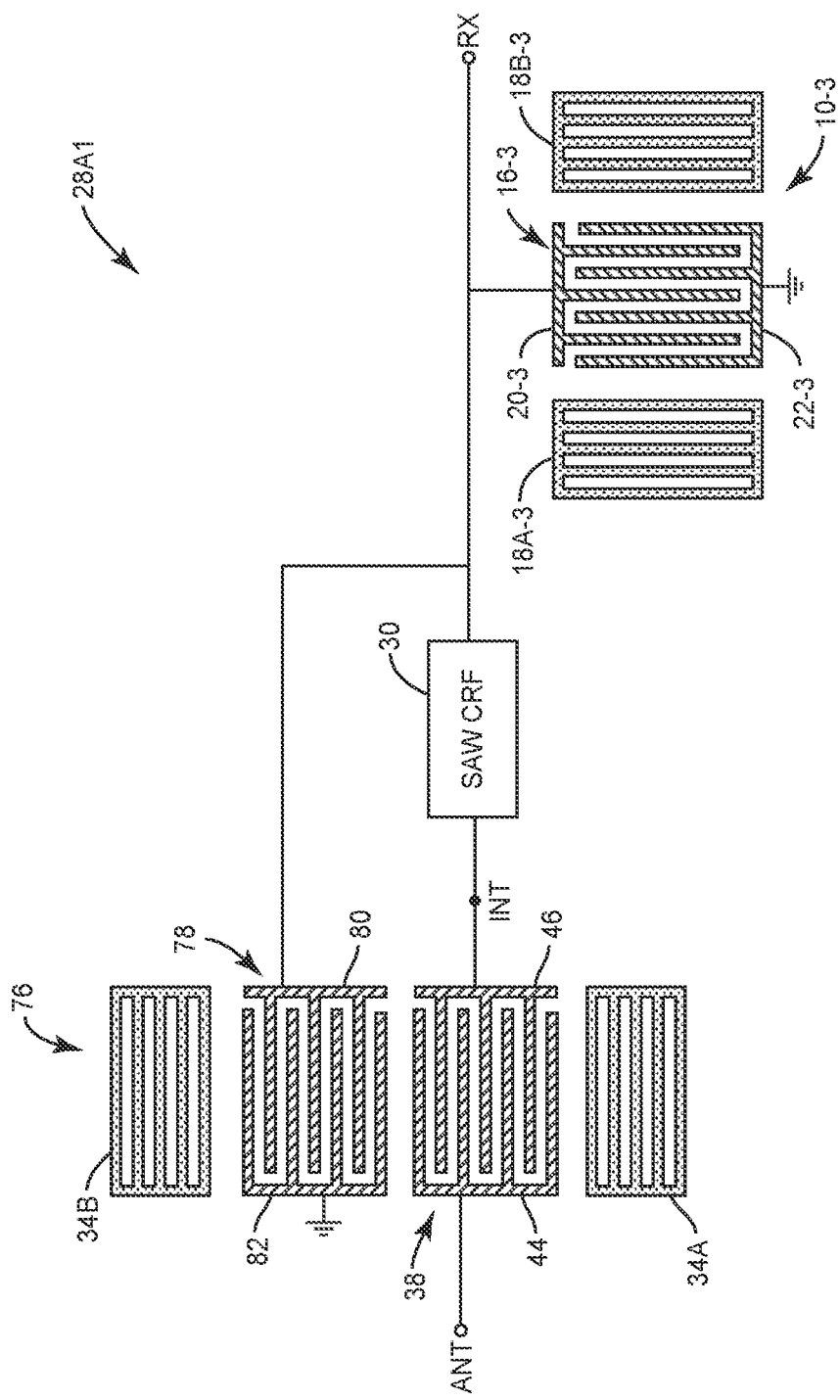
FIG. 6 shows an alternative RX filter that includes a three-signal-terminal ladder-type SAW device.

FIG. 6 shows a first alternative RX filter 28A1 that includes a three-signal-terminal ladder-type SAW device 76. Herein, the third shunt SAW resonator 10-3, the SAW CRF 30, and the three-signal-terminal ladder-type SAW device 76 share a common piezoelectric layer (not shown). The three-signal-terminal ladder-type SAW device 76 includes the two reflective structures 34A and 34B, one first series IDT 38, and one third shunt IDT 78. Herein, the third shunt SAW resonator 10-3 is still coupled between the RX point and ground. The SAW CRF 30 is still coupled between the INT point and the RX point, and also coupled to ground. The first series IDT 38 of the three-signal-terminal ladder-type SAW device 76 is coupled between the ANT point and the INT point, and the third shunt IDT 78 of the three-signal-terminal ladder-type SAW device 76 is coupled between the RX point and ground. The first series IDT 38 and the third shunt IDT 78 are arranged between the two reflective structures 34A and 34B.

For the purpose of this illustration, the first electrode 44 of the first series IDT 38 is coupled to the ANT point and includes four electrode fingers, and the second electrode 46 of the first series IDT 38 is coupled to the INT point and includes three electrode fingers. The third shunt IDT 78 includes a first electrode 80 coupled to the RX point with three electrode fingers, and a second electrode 82 coupled to ground with four electrode fingers. Notice that the first electrode 44 of the first series IDT 38, the second electrode 46 of the first series IDT 38, and the first electrode 80 of the third shunt IDT 78 are the three signal terminals of the three-signal-terminal ladder-type SAW device 76. In different applications, the first and second electrodes 44 and 46 of the first series IDT 38 may have fewer or more electrode fingers. The first and second electrodes 80 and 82 of the third shunt IDT 78 may have fewer or more electrode fingers.

Figure 7:
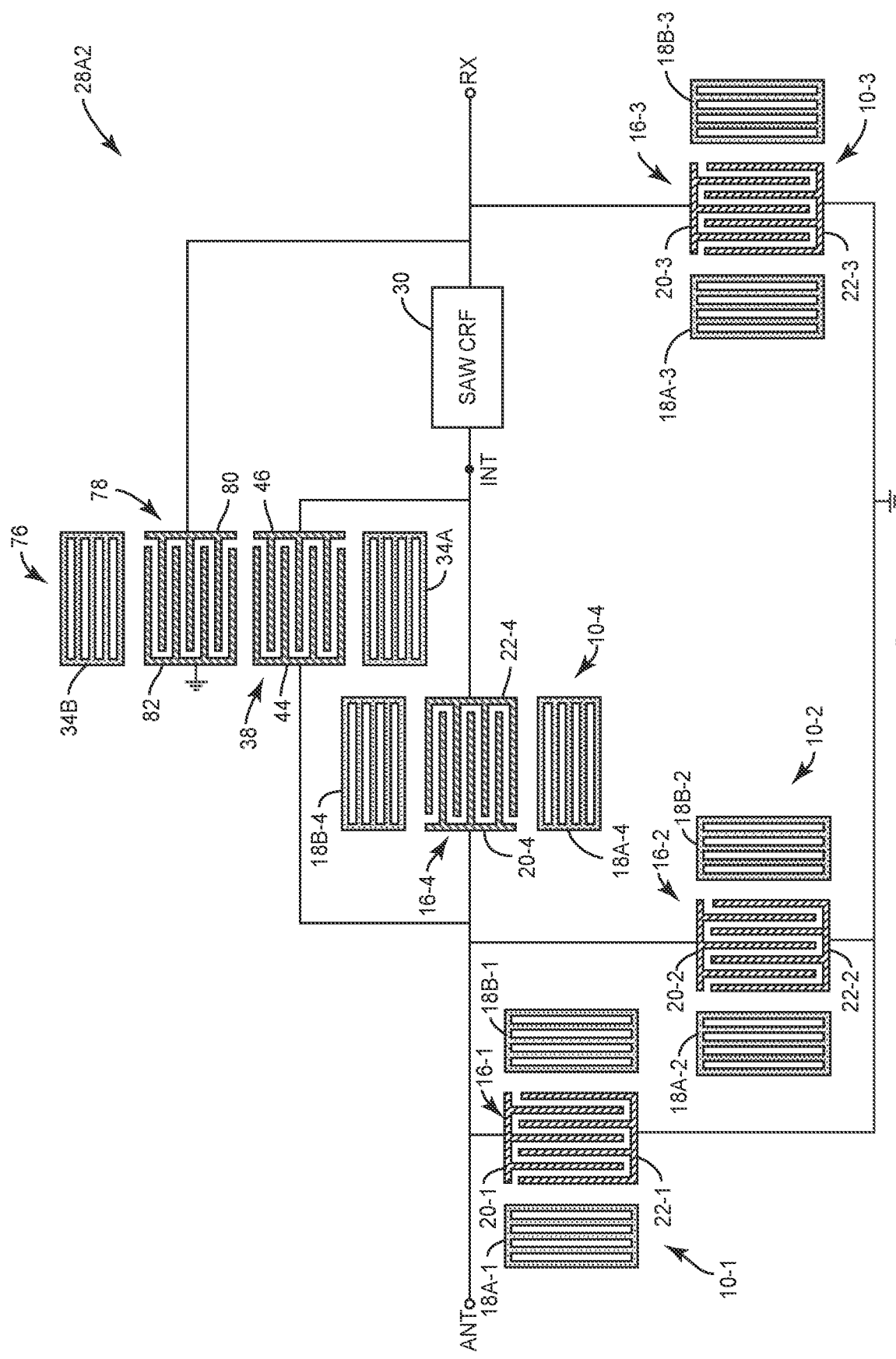
FIG. 7 shows an alternative RX filter that includes a three-signal-terminal ladder-type SAW device.

FIG. 7 shows a second alternative RX filter 28A2, which combines the configuration of the RX filter 28 shown in FIG. 2B and the three-signal-terminal ladder-type SAW device 76. Herein, the first shunt SAW resonator 10-1, the second shunt SAW resonator 10-2, the third shunt SAW resonator 10-3, the series SAW resonator 10-4, the SAW CRF 30, and the three-signal-terminal ladder-type SAW device 76 share a common piezoelectric layer (not shown). The first shunt SAW resonator 10-1 and the second shunt SAW resonator 10-2 are parallel to each other and both coupled between the ANT point and ground. The third shunt SAW resonator 10-3 is coupled between the RX point and ground. The series SAW resonator 10-4 is coupled between the ANT point and the INT point. The SAW CRF 30 is coupled between the INT point and the RX point, and also coupled to ground. The first series IDT 38 of the three-signal-terminal ladder-type SAW device 76 is coupled between the ANT point and the INT point. The third shunt IDT 78 of the three-signal-terminal ladder-type SAW device 76 is coupled between the RX point and ground.

Figure 8A:
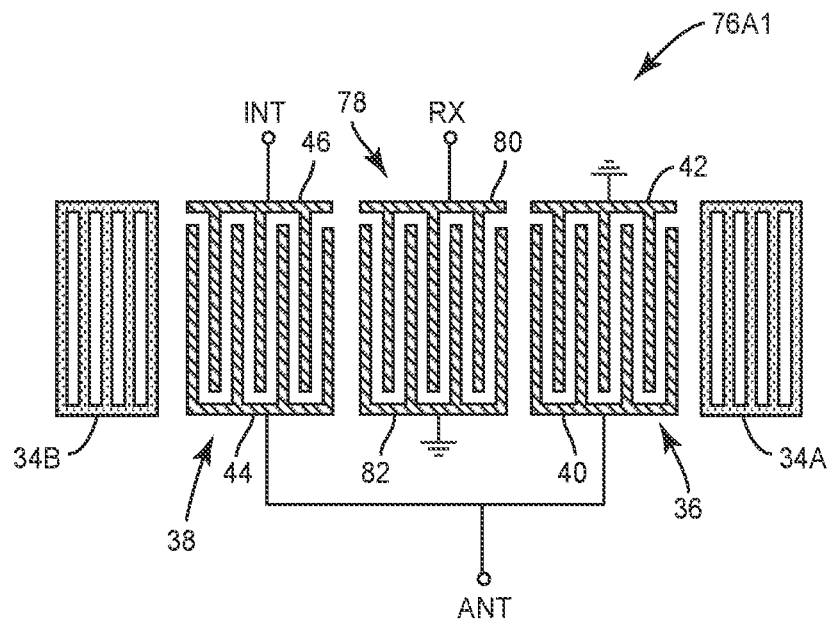
FIGS. 8A-8B show alternative three-signal-terminal ladder-type SAW devices.
Figure 8B:
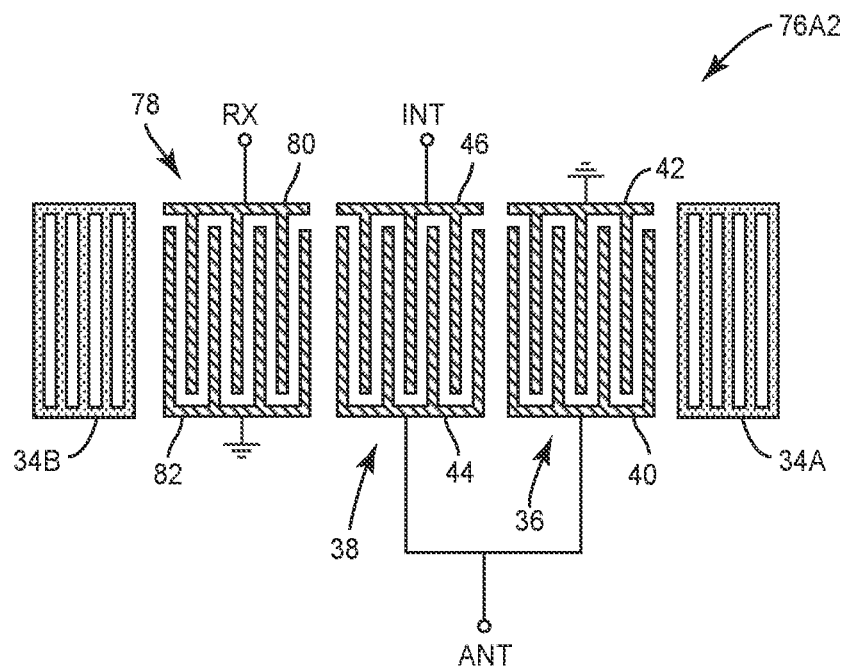

FIGS. 8A-8B show alternative three-signal-terminal ladder-type SAW devices, each of which may replace the three-signal-terminal ladder-type SAW device 76 in the RX filter 28A1 or 28A2. A first alternative three-signal-terminal ladder-type SAW device 76A1 includes the reflective structures 34A and 34B, one first shunt IDT 36, one first series IDT 38, and one third shunt IDT 78, as illustrated in FIG. 8A. Herein, the first shunt IDT 36 is coupled between the ANT point and ground. The first series IDT 38 is coupled between the ANT point and the INT point. The third shunt IDT 78 is coupled between the RX point and ground. The first shunt IDT 36 and the third shunt IDT 78 are placed at one side of the first series IDT 38. In one embodiment, the third shunt IDT 78 is placed between the first shunt IDT 36 and the first series IDT 38. The first shunt IDT 36, the third shunt IDT 78, and the first series IDT 38 are arranged between the two reflective structures 34A and 34B. For the purpose of this illustration, the first electrode 40 of the first shunt IDT 36 is coupled to the ANT point and includes four electrode fingers, and the second electrode 42 of the first shunt IDT 36 is coupled to ground and includes three electrode fingers. The first electrode 44 of the first series IDT 38 is coupled to the ANT point and includes four electrode fingers, and the second electrode 46 of the first series IDT 38 is coupled to the INT point and includes three electrode fingers. The first electrode 80 of the third shunt IDT 78 is coupled to the RX point and includes three electrode fingers, and the second electrode 82 of the third shunt IDT 78 is coupled to ground and includes four electrode fingers. In different applications, the first and second electrodes 40 and 42 of the first shunt IDT 36 may have fewer or more electrode fingers. The first and second electrodes 44 and 46 of the first series IDT 38 may have fewer or more electrode fingers. The first and second electrodes 80 and 82 of the third shunt IDT 78 may have fewer or more electrode fingers.

A second alternative three-signal-terminal ladder-type SAW device 76A2 also includes the reflective structures 34A and 34B, the first shunt IDT 36, the first series IDT 38, and the third shunt IDT 78, as illustrated in FIG. 8B. Herein, the first shunt IDT 36 is coupled between the ANT point and ground. The first series IDT 38 is coupled between the ANT point and the INT point. The third shunt IDT 78 is coupled between the RX point and ground. The first series IDT 38 is placed between the first shunt IDT 36 and the third shunt IDT 78. The first shunt IDT 36, the third shunt IDT 78, and the first series IDT 38 are arranged between the two reflective structures 34A and 34B. For the purpose of this illustration, the first electrode 40 of the first shunt IDT 36 is coupled to the ANT point and includes four electrode fingers, and the second electrode 42 of the first shunt IDT 36 is coupled to ground and includes three electrode fingers. The first electrode 44 of the first series IDT 38 is coupled to the ANT point and includes four electrode fingers, and the second electrode 46 of the first series IDT 38 is coupled to the INT point and includes three electrode fingers. The first electrode 80 of the third shunt IDT 78 is coupled to the RX point and includes three electrode fingers, and the second electrode 82 of the third shunt IDT 78 is coupled to ground and includes four electrode fingers. In different applications, the first and second electrodes 40 and 42 of the first shunt IDT 36 may have fewer or more electrode fingers. The first and second electrodes 44 and 46 of the first series IDT 38 may have fewer or more electrode fingers. The first and second electrodes 80 and 82 of the third shunt IDT 78 may have fewer or more electrode fingers.

Those skilled in the art will recognize improvements and modifications to the preferred embodiments of the present disclosure. All such improvements and modifications are considered within the scope of the concepts disclosed herein and the claims that follow.

What is claimed is:

1. A surface acoustic wave (SAW) device, comprising:
a piezoelectric layer;
two reflective structures;
a first shunt interdigital transducer (IDT) coupled between a first signal point and ground; and
a series IDT coupled between a second signal point and a third signal point, wherein:
the first signal point, the second signal point, the third signal point, and the ground are not directly electrically connected;
the two reflective structures, the first shunt IDT, and the series IDT reside over the piezoelectric layer; and
the first shunt IDT and the series IDT are arranged between the two reflective structures.

2. The SAW device of claim 1 wherein:
the first series IDT comprises a plurality of first electrode fingers coupled to the second signal point and a plurality of second electrode fingers coupled to the third signal point; and
the first shunt IDT comprises a plurality of first electrode fingers coupled to the first signal point and a plurality of second electrode fingers coupled to the ground.

3. The SAW device of claim 2 wherein a number of the plurality of first electrode fingers of the first series IDT is the same as a number of the plurality of second electrode fingers of the first series IDT.

4. The SAW device of claim 2 wherein a number of the plurality of first electrode fingers of the first series IDT is different from a number of the plurality of second electrode fingers of the first series IDT.

5. The SAW device of claim 2 wherein a number of the plurality of first electrode fingers of the first shunt IDT is the same as a number of the plurality of second electrode fingers of the first shunt IDT.

6. The SAW device of claim 2 wherein a number of the plurality of first electrode fingers of the first shunt IDT is different from a number of the plurality of second electrode fingers of the first shunt IDT.

7. The SAW device of claim 1 further comprising a second shunt IDT residing over the piezoelectric layer and arranged between the two reflective structures, wherein the second shunt IDT is coupled between the second signal point and the ground.

8. The SAW device of claim 7 wherein the series IDT is arranged between the first shunt IDT and the second shunt IDT.

9. The SAW device of claim 7 wherein the first shunt IDT and the second shunt IDT are arranged at one side of the series IDT.

10. The SAW device of claim 7 wherein:
the first series IDT comprises a plurality of first electrode fingers coupled to the second signal point and a plurality of second electrode fingers coupled to the third signal point;
the first shunt IDT comprises a plurality of first electrode fingers coupled to the first signal point, and a plurality of second electrode fingers coupled to the ground; and the second shunt IDT comprises a plurality of first electrode fingers coupled to the second signal point, and a plurality of second electrode fingers coupled to the ground.

11. The SAW device of claim 10 wherein a number of the plurality of first electrode fingers of the second shunt IDT is the same as a number of the plurality of second electrode fingers of the second shunt IDT.

12. The SAW device of claim 10 wherein a number of the plurality of first electrode fingers of the second shunt IDT is different from a number of the plurality of second electrode fingers of the second shunt IDT.

13. The SAW device of claim 10 wherein a number of the plurality of first electrode fingers of the first series IDT is the same as a number of the plurality of second electrode fingers of the first series IDT.

14. The SAW device of claim 10 wherein a number of the plurality of first electrode fingers of the first series IDT is different from a number of the plurality of second electrode fingers of the first series IDT.

15. The SAW device of claim 10 wherein a number of the plurality of first electrode fingers of the first shunt IDT is the same as a number of the plurality of second electrode fingers of the first shunt IDT.

16. The SAW device of claim 10 wherein a number of the plurality of first electrode fingers of the first shunt IDT is different from a number of the plurality of second electrode fingers of the first shunt IDT.

17. The SAW device of claim 7 wherein the first shunt IDT is identical to the second shunt IDT.

18. The SAW device of claim 7 wherein no reflective structure is arranged between the first shunt IDT and the series IDT, between the first shunt IDT and the second shunt IDT, or between the second shunt IDT and the series IDT.

19. The SAW device of claim 1 wherein no reflective structure is arranged between the first shunt IDT and the series IDT.

20. The SAW device of claim 1 wherein:
the piezoelectric layer is formed of one of a group consisting of lithium tantalate (LT) and lithium niobate (LiNbO$_3$);
the two reflective structures are formed of aluminum (Al); and
the first shunt IDT and the series IDT are formed of Al.

* * * * *